United States Patent
Doornbos et al.

(10) Patent No.: US 12,191,375 B2
(45) Date of Patent: *__Jan. 7, 2025__

(54) FERROELECTRIC CHANNEL FIELD EFFECT TRANSISTOR

(71) Applicant: Taiwan Semiconductor Manufacturing Co., Ltd., Hsinchu (TW)

(72) Inventors: Gerben Doornbos, Kessel-Lo (BE); Marcus Johannes Henricus van Dal, Linden (BE); Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,331

(22) Filed: Jul. 28, 2023

(65) Prior Publication Data
US 2023/0378309 A1    Nov. 23, 2023

Related U.S. Application Data

(63) Continuation of application No. 17/813,653, filed on Jul. 20, 2022, now Pat. No. 11,784,234, which is a (Continued)

(51) Int. Cl.
*H01L 29/51* (2006.01)
*H01L 29/04* (2006.01)
(Continued)

(52) U.S. Cl.
CPC ............ *H01L 29/516* (2013.01); *H01L 29/04* (2013.01); *H01L 29/207* (2013.01);
(Continued)

(58) Field of Classification Search
CPC ..... H01L 29/66522; H01L 29/20–2006; H01L 29/78648; H01L 29/516; H01L 29/04; H01L 29/6684; H10B 51/30
See application file for complete search history.

(56) References Cited

U.S. PATENT DOCUMENTS 11,784,234 B2 * 10/2023 Doornbos ............. H01L 29/516
257/295
11,843,058 B2 * 12/2023 Dewey ............ H01L 21/823807
(Continued)

FOREIGN PATENT DOCUMENTS

CN         110534573 A     12/2019
WO        2005091350 A1     9/2005

OTHER PUBLICATIONS

US 11,452,609 B2, 09/2022, Doornbos (withdrawn)
(Continued)

*Primary Examiner* — Jose R Diaz
(74) *Attorney, Agent, or Firm* — HAYNES AND BOONE, LLP

(57) ABSTRACT

Semiconductor devices and methods of forming the same are provided. A semiconductor device according to the present disclosure includes a ferroelectric structure including a channel region and a source/drain region, a gate dielectric layer disposed over the channel region of the ferroelectric structure, a gate electrode disposed on the gate dielectric layer, and a source/drain contact disposed on the source/drain region of the ferroelectric structure. The ferroelectric structure includes gallium nitride, indium nitride, or indium gallium nitride. The ferroelectric structure is doped with a dopant.

20 Claims, 17 Drawing Sheets

Related U.S. Application Data continuation of application No. 16/888,393, filed on May 29, 2020, now Pat. No. 11,482,609.

(51) Int. Cl.

| | | |
|---|---|---|
| *H01L 29/207* | (2006.01) | |
| *H01L 29/66* | (2006.01) | |
| *H01L 29/78* | (2006.01) | |
| *H01L 29/786* | (2006.01) | |
| *H10B 51/30* | (2023.01) | |

(52) U.S. Cl.
CPC ...... *H01L 29/6684* (2013.01); *H01L 29/7855* (2013.01); *H01L 29/78648* (2013.01); *H10B 51/30* (2023.02); *H01L 2029/7858* (2013.01)

(56) References Cited

U.S. PATENT DOCUMENTS

| | | | |
|---|---|---|---|
| 11,887,988 B2* | 1/2024 | Agrawal | ............. H01L 29/1033 |
| 2006/0239060 A1 | 10/2006 | Shimada | |
| 2018/0166576 A1 | 6/2018 | Wang | |
| 2021/0083122 A1 | 3/2021 | Naylor et al. | |

OTHER PUBLICATIONS

S. Fichtner, Niklas Wolff, Fabian Lofink, Lorenz, Kienle, and Bernhard Wagner, AlScN: A III-V semiconductor based ferroelectric, J. Appl. Phys. 125, 114103 (2019); https://doi.org/10.1063/1.5084945.

S. Fichtner, Niklas Wolff, Gnanavel Krishnamurthy, Adrian Petraru, Sascha Bohse, Fabian Lofink, Steffen Chemnitz, Hermann Kohlstedt, Lorenz, Kienle, and Bernhard Wagner, Identifying and overcoming the interface originating c-axis instability in highly Sc enhanced AlN for piezoelectric microelectromechanical systems, J. Appl. Phys. 122, 035301 (2017); https://doi.org/10.1063/1.4993908.

Min Hyuk Park, Young Hwan Lee, Thomas Mikolajick, Uwe Schroeder and Cheol Seong Hwang, Review and perspective on ferroelectric HfO2-based thin films for memory applications, MRS Communications (2018), 8, 795-808; https:/ /doi.org/10.1557/mrc.2018.175.

Siyuan Zhang, David Holec, Wai Yuen Fu, Colin J. Humphreys, and Michell A. Moram, Tunable optoelectronic and ferroelectric properties in Sc-based III-nitrides, J. Appl. Phys. 114, 133510 (2013); https://doi.org/10.1063.1.4824179.

* cited by examiner

FERROELECTRIC CHANNEL FIELD EFFECT TRANSISTOR

PRIORITY DATA

This application is a continuation of U.S. patent application Ser. No. 17/813,653, filed Jul. 20, 2022, which is a continuation of U.S. patent application Ser. No. 16/888,393, filed May 29, 2020, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Several novel non-volatile memory devices have emerged over the years. One of them is a ferroelectric field effect transistor (FEFET). In some examples, a FEFET includes a ferroelectric layer and a gate dielectric layer disposed over the channel. As devices are scaled down, the introduction of the ferroelectric layer may pose additional challenges in scaling down FEFETs. For example, some conventional ferroelectric materials may exhibit ferroelectricity when they are in a specific crystalline phase out of several possible crystalline phases. This makes it challenging as it requires to control the crystalline phase of the ferroelectric material as it is formed. In addition, the presence of other phases in the ferroelectric layer may result in wake-up effects and ferroelectricity fatigue. For another example, these conventional ferroelectric materials may give rise to sufficient polarization when they are formed to sufficient thicknesses. The thickness of the ferroelectric layer may hinder the ability to scale down semiconductor devices. Therefore, although FEFETs have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
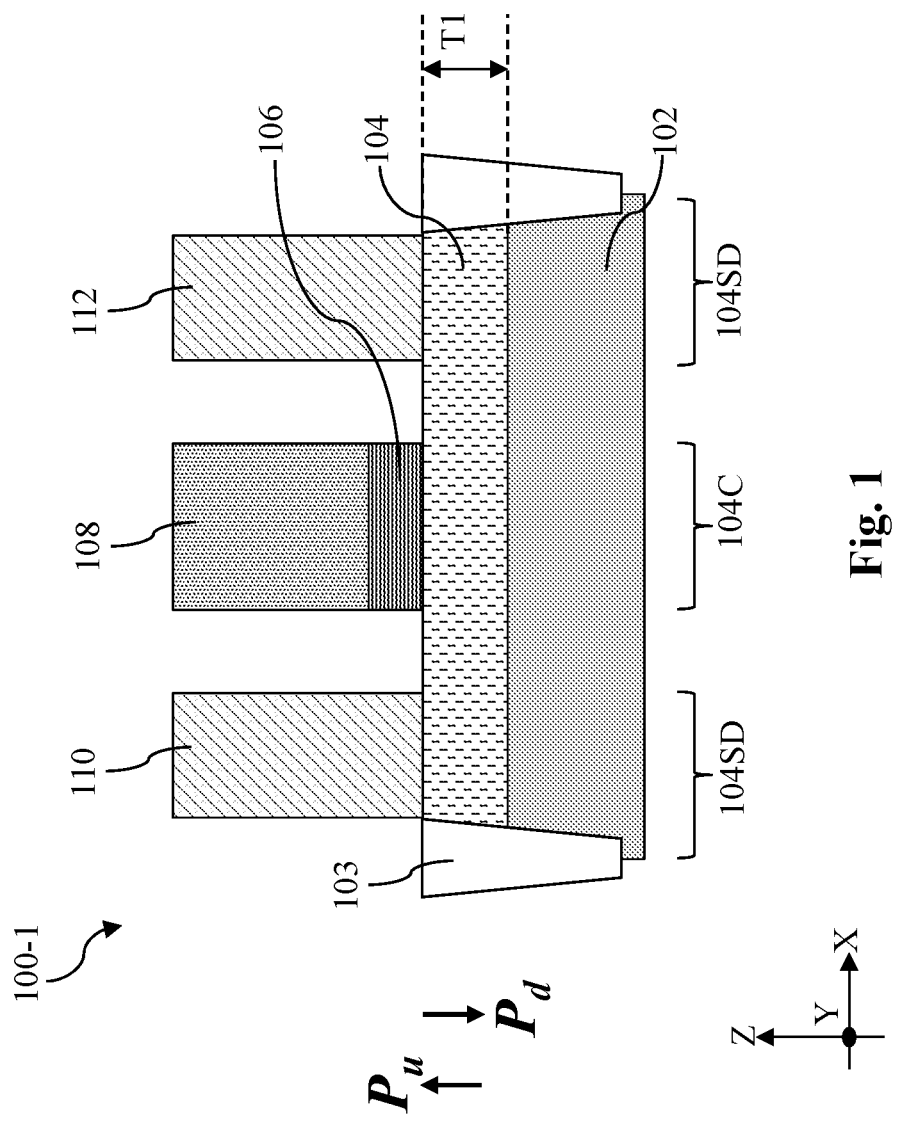
FIGS. 1-4 illustrate schematic cross-sectional views of example semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a semiconductor device of which the channel includes a ferroelectric semiconductor material.

Researches have been done to identify memory devices that are integratable with existing IC fabrication processes, are non-volatile, and have low power consumption. One of the front runners is a ferroelectric field effect transistor (FEFET) that has a ferroelectric layer disposed between the gate electrode and the channel. As a result, the ferroelectric layer of a FEFET becomes a part of the gate structure that is disposed over the channel. Inclusion of the ferroelectric layer in the gate structure of an FEFET presents several challenges. Example challenges include difficulties in forming the ferroelectric layer, wake-up effect, ferroelectricity fatigue, and scalability.

Ferroelectric layers in FEFETs may be difficult to form. For example, when the ferroelectric layer is formed of hafnium silicate or hafnium zirconium oxide, each of hafnium silicate or hafnium zirconium oxide has one ferroelectric phase (i.e., the orthorhombic phase) as well as several non-ferroelectric crystallographic phases (e.g., the cubic, tetragonal, or monoclinic phase). An ideal ferroelectric layer formed of hafnium silicate or hafnium zirconium oxide would therefore have an orthorhombic crystalline structure. However, realistically, it is very difficult to control the formation process of hafnium silicate layer or hafnium zirconium oxide layer to ensure that it is single crystalline and orthorhombic. Other phases may be present in the ferroelectric layer and undercut its ferroelectricity.

Presence of multiple phases of hafnium silicate or hafnium zirconium oxide ferroelectric layers may also give rise to wake-up effect and ferroelectricity fatigue. It has been observed that substantial wake-up cycles, such as 1,000 and 10,000 cycles, may be needed to enlarge the polarization window for the FEFET. It is believed that these wake-up cycles are needed because the hafnium silicate or hafnium zirconium oxide ferroelectric layers have phases other than the orthorhombic phase and charges have to move between different phases. After the ferroelectric layer has gone through multiple polarization cycles, charges may be trapped at interfaces of different crystalline phases. Over time, the polarization may become weaker until the ferroelectric layer loses its ferroelectricity partly or entirely. This phenomenon is referred to as fatigue or ferroelectricity fatigue.

FEFETs also face scalability challenges. Because ferroelectricity is a bulk property, the ferroelectric layer may require a minimum thickness to exhibit ferroelectricity. Researches indicated that when hafnium zirconium oxide is less than 4 nanometers (nm) thick, it may lose ferroelectricity. With the ferroelectric layer being part of the gate structure in an FEFET, such a minimum thickness requirement may substantially hinder the ability for FEFETs to be scaled down.

The present disclosure provides a semiconductor device of which a channel (or a channel member) includes a ferroelectric semiconductor material. Such a semiconductor device may be referred to as a ferroelectric channel field effect transistor (FCFET). In some implementations, the ferroelectric channel may be formed of or include a III-V compound semiconductor material, such as gallium nitride, indium nitride, and indium gallium nitride. The III-V compound semiconductor material is doped with a dopant such as scandium (Sc) such that the III-V compound semiconductor material is ferroelectric. The doped III-V compound semiconductor material of the present disclosure only has a single crystalline phase and its placement in the channel allows it to have a desired thickness without harming the scalability of the semiconductor device. In addition, because the doped III-V compound semiconductor material of the present disclosure only has a single crystalline phase, the FCFET of the present disclosure does not require wake-up cycles and does not suffer from ferroelectricity fatigue.

The present disclosure provides several embodiments of FCFETs. Reference is first made to FIG. 1, which illustrates a cross-sectional view of a first semiconductor device 100-1. The first semiconductor device 100-1 is a FCFET. As shown in FIG. 1, the first semiconductor device 100-1 includes a substrate 102, a ferroelectric semiconductor layer 104 disposed over the substrate 102, a gate dielectric layer 106 disposed over a channel region 104C of the ferroelectric semiconductor layer 104, a gate electrode 108 over the gate dielectric layer 106, a first source/drain contact 110 and a second source/drain contact 112 disposed over the source/drain regions 104SD of the ferroelectric semiconductor layer 104. According to some embodiments of the present disclosure, the substrate 102 may be formed of silicon, silicon oxide, silicon carbide, gallium nitride, or aluminum gallium nitride. The ferroelectric semiconductor layer 104 may include a III-V compound semiconductor and a dopant. The III-V compound semiconductor may include gallium nitride, indium nitride, or indium gallium nitride. The dopant may include scandium. A composition of the gate dielectric layer 106 may be different from that of the ferroelectric semiconductor layer 104. In a grand scheme, the gate dielectric layer 106 is insulative while the ferroelectric semiconductor layer 104 is semiconductive. In some embodiments, the gate dielectric layer 106 may be formed of hafnium oxide, silicon oxide, aluminum oxide, aluminum nitride, other suitable high-k dielectric materials, or other wide bandgap semiconductor materials. The gate electrode 108 may be formed of tungsten, nickel, tantalum, titanium, aluminum, copper, cobalt, tantalum nitride, titanium nitride, ruthenium or other suitable conductive materials. The gate dielectric layer 106 and the gate electrode 108 may be collectively referred to as a gate structure.

The ferroelectric semiconductor layer 104 may be formed on the substrate 202 by epitaxial growth or layer transfer. With respect to the former, the ferroelectric semiconductor layer 104 may be deposited on the substrate using molecular beam epitaxy (MBE), vapor phase epitaxy (VPE), or metalorganic CVD (MOCVD). For example, gallium nitride, indium nitride, or indium gallium nitride may be deposited on a silicon substrate having a (111) crystal surface, a silicon carbide substrate, or a gallium nitride substrate. With respect to latter, the ferroelectric semiconductor layer 104 may first be deposited on a crystalline carrier substrate that is formed of silicon, silicon carbide, or gallium nitride. Then the ferroelectric semiconductor layer 104 may be transferred to a silicon oxide substrate. Because silicon oxide is a common dielectric material for an intermetallic layer in an interconnect structure, the latter may be used when the first semiconductor device 100-1 is to be fabricated on a conductive layer in an interconnect structure. The ferroelectric semiconductor layer 104 has a wurtzite crystalline structure and the (0001) crystalline face is on the X-Y plane. In other words, the <0001> crystalline direction, which is normal to the (0001) crystalline face, extends along the Z direction.

Referring still to FIG. 1, the first semiconductor device 100-1 may be isolated from a neighboring device by an isolation feature 103. In some embodiments, the 103 may include silicon oxide. In some implementations represented in FIG. 1, the ferroelectric semiconductor layer 104 may include a first thickness T1 along the Z direction and the first thickness T1 may be between about 4 nanometer (nm) and 20 nm. In implementations where a strong ferroelectricity is desired, the first thickness T1 may be between about 10 nm and about 100 nm. The first semiconductor device 100-1 may be applied as a memory device. When used as a memory device, the gate electrode 108 serves as a gate for both WRITE and READ operations. Put differently, the first semiconductor device 100-1 may be used as a single-port memory device. In an example WRITE operation, a negative write voltage may be applied to the gate electrode 108 to induce an upward polarization ($P_u$) in the ferroelectric semiconductor layer 104 and a positive write voltage may be applied to the gate electrode to induce a downward polarization ($P_d$) in the ferroelectric semiconductor layer 104. The downward and upward polarizations induce sheet immobile charge densities of opposite signs at the upper and lower interfaces of the ferroelectric semiconductor layer 104. The immobile charges originate from charged atoms that physically move in response to the positive and negative write voltages. The downward polarization ($P_d$) and the upward polarization ($P_u$) may increase or lower the threshold voltage of the channel in the ferroelectric semiconductor layer 104. When a read voltage is applied at the gate electrode 108, the read voltage may result in different on-state current levels as the threshold voltage has been shifted by the polarization. The difference states allow a read of the data stored in the first semiconductor device 100-1. The induced remnant polarization is bi-stable (i.e., stable in one of only two states unless a write voltage is applied). Once the downward polarization or the upward polarization is written into the ferroelectric semiconductor layer 104, such polarization may retain in the ferroelectric semiconductor layer 104 without further power consumption at the gate electrode 108.

Figure 2:
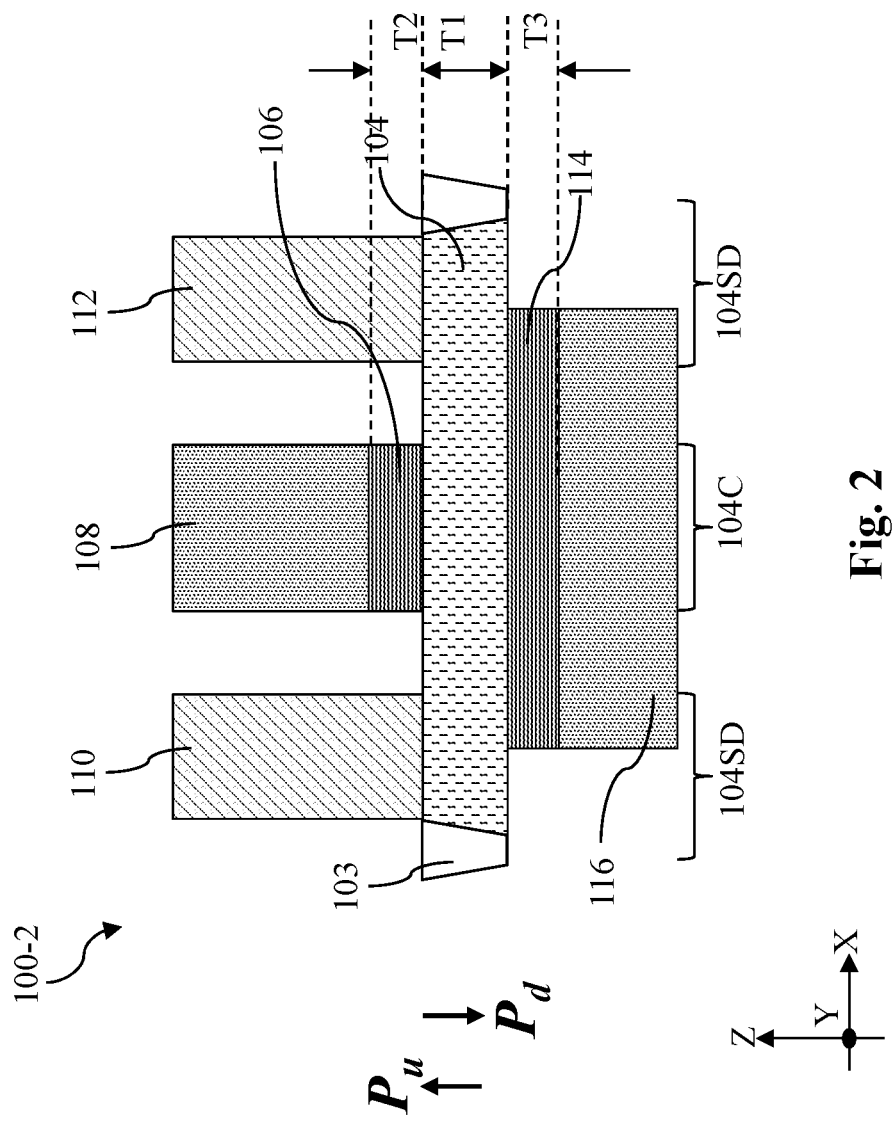

Reference is then made to FIG. 2, which illustrates a cross-sectional view of a second semiconductor device 100-2 according to various aspects of the present disclosure. As compared to the first semiconductor device 100-1, the second semiconductor device 100-2 includes a back gate dielectric layer 114 and a back gate electrode 116. In this regard, to distinguish from the back gate dielectric layer 114 and the back gate electrode 116, the gate dielectric layer 106 and the gate electrode 108 may be referred to as front gate dielectric layer 106 and the front gate electrode 108. The second semiconductor device 100-2 may be applied as a memory device. When used as a memory device, the front gate electrode 108 may serve as a gate for READ operations and the back gate electrode 116 may serve as a gate for WRITE operations. In other words, the second semiconductor device 100-2 may be used as a dual-port memory device. In an example WRITE operation, a positive write voltage may be applied to the back gate electrode 116 to induce an upward polarization ($P_u$) in the ferroelectric semiconductor layer 104 and a negative write voltage may be applied to the gate electrode to induce a downward polarization ($P_d$) in the ferroelectric semiconductor layer 104. The downward and upward polarizations induce sheet immobile charge densities of opposite signs at the upper and lower interfaces of the ferroelectric semiconductor layer 104. The immobile charges originate from charged atoms that physically move in response to the positive and negative write voltages. The downward polarization ($P_d$) and the upward polarization ($P_u$) may increase or lower the threshold voltage of the channel in the ferroelectric semiconductor layer 104. When a read voltage is applied at the gate electrode 108, the read voltage may result in different on-state current levels as the threshold voltage has been shifted by the polarization. The difference states allow a read of the data stored in the second semiconductor device 100-2. The induced remnant polarization is bi-stable (i.e., stable in one of two states unless a write voltage is applied). Once the downward polarization or the upward polarization is written into the ferroelectric semiconductor layer 104, such polarization may retain in the ferroelectric semiconductor layer 104 without further power consumption at the back gate electrode 116.

In some implementations, the write voltage at the back gate electrode 116 during WRITE operations is greater than the read voltage at the front gate electrode 108 during READ operations. Those implementations have advantages because once data is written by a higher write voltage and is retained in the second semiconductor device 100-2, only a lower read voltage is needed to retrieve the data. This may lead to improved power consumption. A magnitude of the write voltage (including the positive write voltage and the negative write voltage) may be greater than the read voltage. In some instances, a magnitude of the write voltage (including the positive write voltage and the negative write voltage) may be between about 1 volt (V) and about 4 V while the read voltage may be between about 0 V and about 1 V. To accommodate the different read and write voltages, the back gate dielectric layer 114 may be thicker than the front gate dielectric layer 106. In some implementations represented in FIG. 2, the front gate dielectric layer 106 may have a second thickness T2 and the back gate dielectric layer 114 may have a third thickness T3. The third thickness T3 is greater than the second thickness T2. In some embodiments, the second thickness T2 may be between about 1 nm and about 2 nm and the third thickness T3 may be between about 4 nm and about 20 nm. While not separately illustrated and described, embodiments where the front gate electrode 108 serves as a write gate and the back gate electrode 116 serves as a read gate are fully envisioned.

Figure 3:
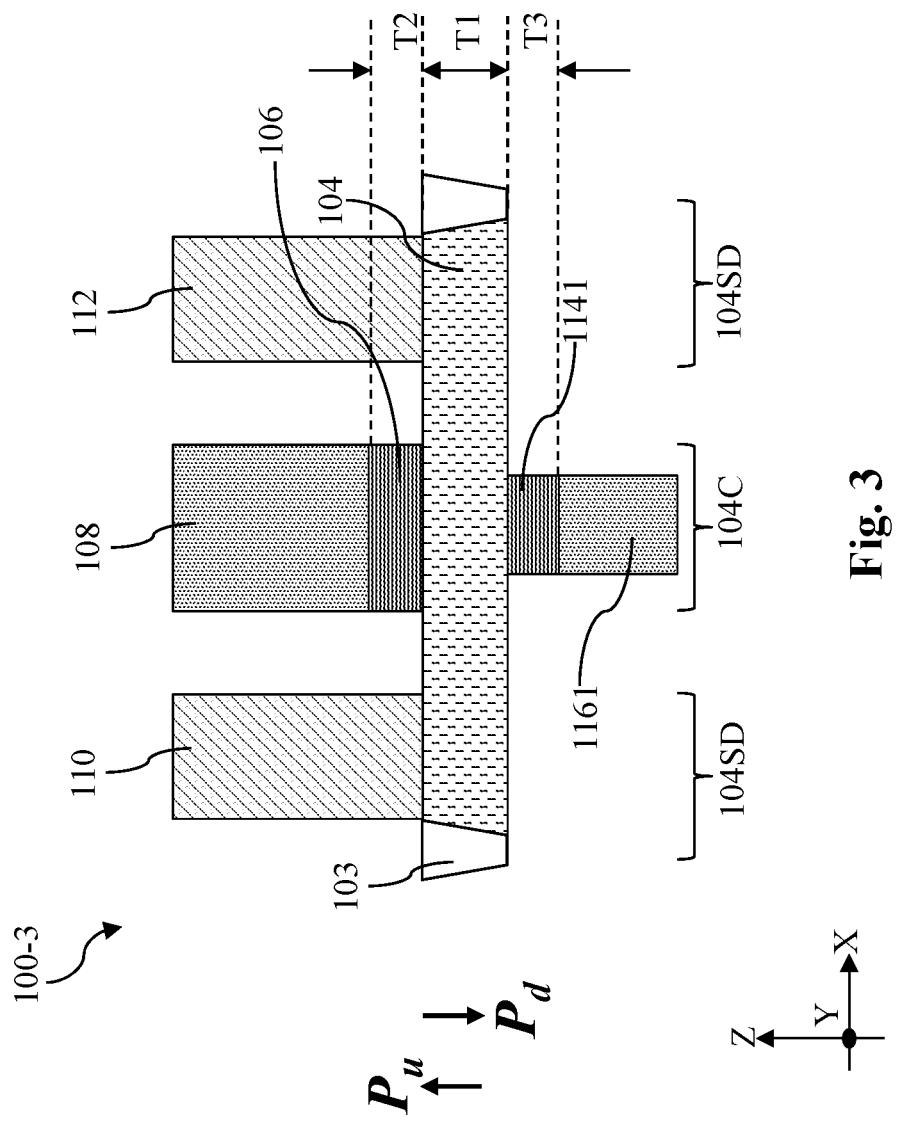

Reference is made to FIG. 3, which illustrates a cross-sectional view of a third semiconductor device 100-3 according to various aspects of the present disclosure. As compared to the second semiconductor device 100-2, the third semiconductor device 100-3 includes a narrow back gate dielectric layer 1141 and a narrow back gate electrode 1161 that do not extend, along the X direction, into the source/drain regions 104SD. In some implementations, the narrow back gate dielectric layer 1141 and the narrow back gate electrode 1161 may be disposed completely and directly below the channel region 104C of the ferroelectric semiconductor layer 104. In embodiments where the ferroelectric semiconductor layer 104 is crystalline, upward or downward polarization may propagate within the ferroelectric semiconductor layer 104 at the speed of sound until the entire layer is uniformly polarized in one state. This holds true despite of the fact that the narrow back gate dielectric layer 1141 and the narrow back gate electrode 1161 are narrower and are only directly below the channel region 104C. As the operation of the third semiconductor device 100-3 may be substantially similar to that of the second semiconductor device 100-2, description of operation of the third semiconductor device 100-3 is omitted for brevity.

Figure 4:
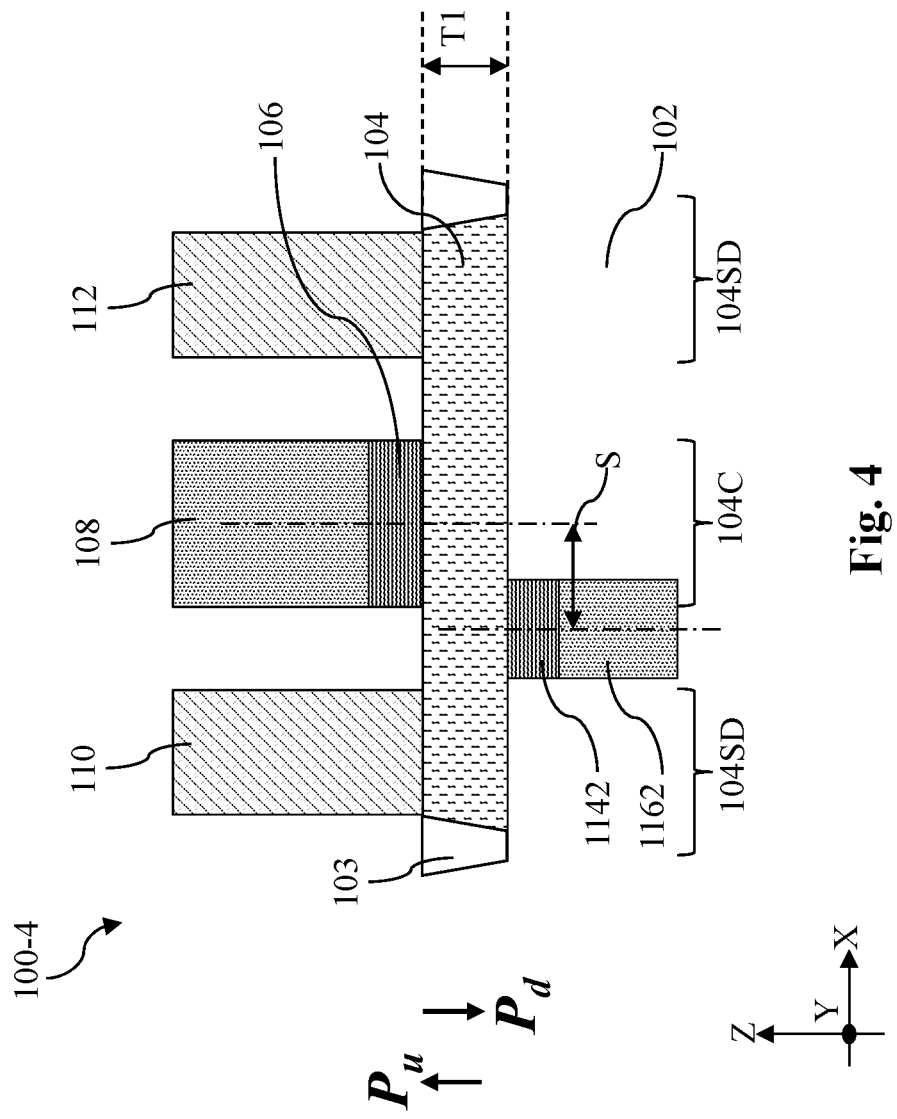

Reference is made to FIG. 4, which illustrates a cross-sectional view of a fourth semiconductor device 100-4 according to various aspects of the present disclosure. As compared to the third semiconductor device 100-3, the narrow back gate dielectric layer 1142 and the narrow back gate electrode 1162 are off-centered. As shown in FIG. 4, a geometric center line of the front gate electrode 108 along the X direction is not aligned with a geometric center line of the narrow back gate electrode 1162 (and the narrow back gate dielectric layer 1142) along the X direction. Rather, their center lines are spaced apart along the X direction by a non-zero spacing S. As described above, in embodiments where the ferroelectric semiconductor layer 104 is crystalline, upward or downward polarization may propagate within the ferroelectric semiconductor layer 104 at the speed of sound until the entire layer is uniformly polarized in one state. This holds true despite of the fact that the narrow back gate dielectric layer 1142 is off-centered. As the operation of the fourth semiconductor device 100-4 may be substantially similar to that of the second semiconductor device 100-2, description of operation of the fourth semiconductor device 100-4 is omitted for brevity.

Figure 5A:
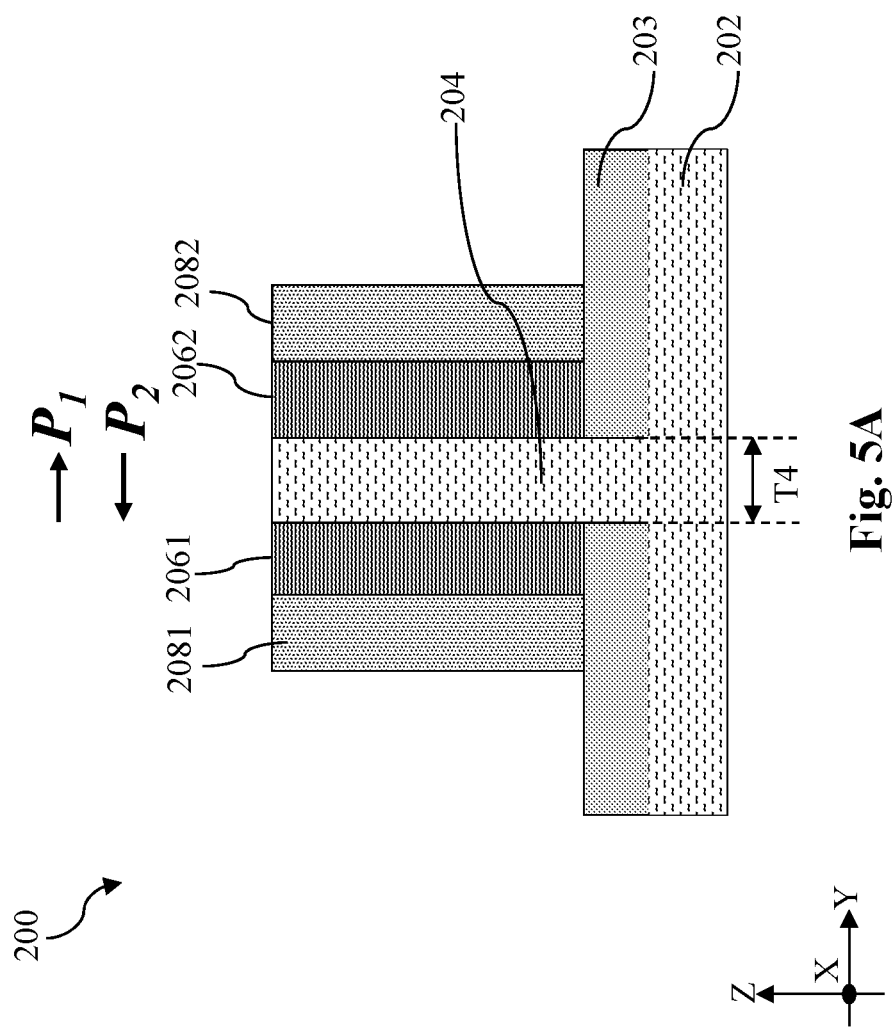
FIGS. 5A and 5B illustrate schematic cross-sectional views of another example semiconductor device, according to various aspects of the present disclosure.
Figure 5B:
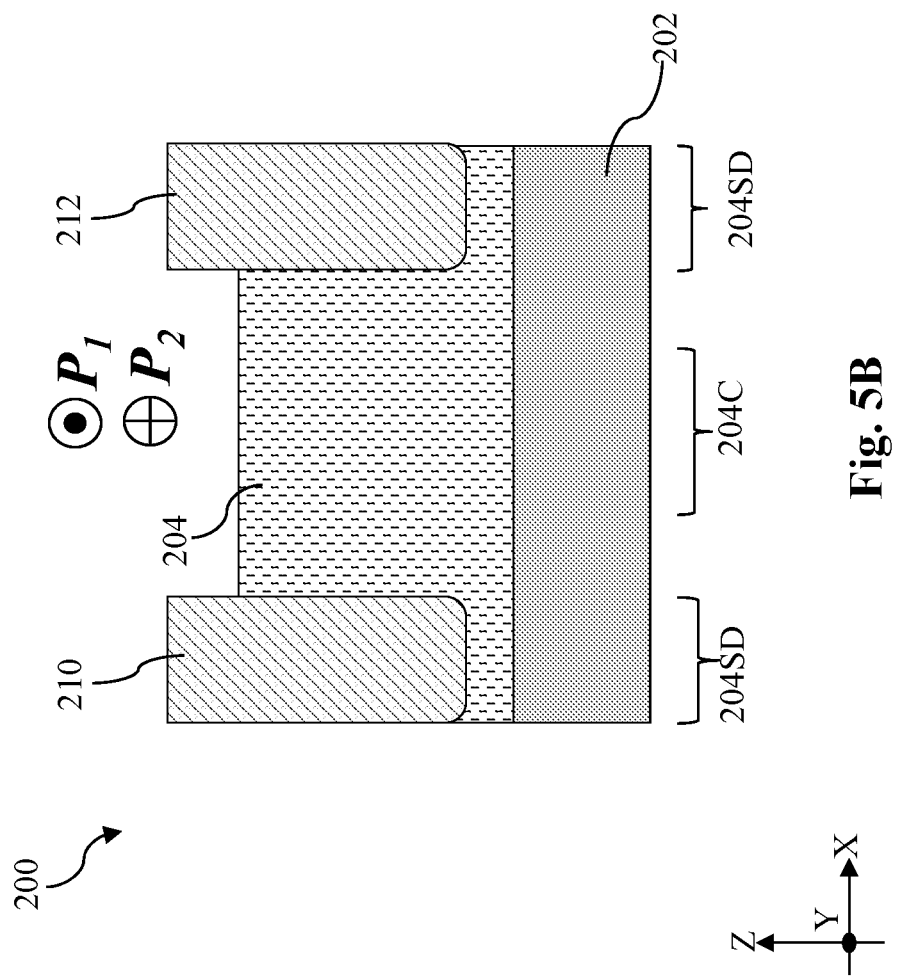

FIGS. 5A and 5B illustrate fragmentary cross-sectional views of a fifth semiconductor device 200 according to aspects of the present disclosure. The fifth semiconductor device 200 is also a FCFET. As shown in FIG. 5A, the fifth semiconductor device 200 includes a substrate 202, an isolation feature 203, a ferroelectric semiconductor fin structure 204 disposed over the substrate 202, a first gate dielectric layer 2061 disposed along a sidewall of the ferroelectric semiconductor fin structure 204, a second gate dielectric layer 2062 disposed along an opposing sidewall of the ferroelectric semiconductor fin structure 204, a first sidewall electrode 2081 disposed along a sidewall of the first gate dielectric layer 2061, a second sidewall electrode 2082 disposed along a sidewall of the second gate dielectric layer 2062. In FIG. 5A, the ferroelectric semiconductor fin structure 204 extends lengthwise along the X direction and is sandwiched between the first gate dielectric layer 2061 and the second gate dielectric layer 2062 along the Y direction. As illustrated in FIG. 5B, the fifth semiconductor device 200 also includes a first source/drain contact 210 and a second source/drain contact 212 disposed over source/drain regions 204SD of the ferroelectric semiconductor fin structure 204. The region between two adjacent source/drain regions 204SD is a channel region 204C. According to some embodiments of the present disclosure, the substrate 302 may be formed of silicon, silicon oxide, silicon carbide, gallium nitride, or aluminum gallium nitride.

The ferroelectric semiconductor fin structure 204 may include a III-V compound semiconductor and a dopant. The III-V compound semiconductor may include gallium nitride, indium nitride, or indium gallium nitride. The dopant may include scandium. As illustrated in FIG. 5A, the ferroelectric semiconductor fin structure 204 has a fourth thickness T4 along the Y direction. In some instance, the fourth width T4 is between about 4 nm and about 20 nm. The ferroelectric semiconductor fin structure 204 has a wurtzite crystalline structure and the (0001) crystalline face is on the X-Z plane. In other words, the <0001> crystalline direction, which is normal to the (0001) crystalline face, extends along the Y direction, between the first gate dielectric layer 2061 and the second gate dielectric layer.

The first gate dielectric layer 2061 and the second gate dielectric layer 2062 may have the same composition that is different from a composition of the gate dielectric layer 106. In some embodiments, the first gate dielectric layer 2061 and the second gate dielectric layer 2062 may be formed of hafnium oxide, silicon oxide, aluminum oxide, aluminum nitride, other suitable high-k dielectric material, or other wide bandgap semiconductor material. Here, aluminum nitride is an example of wide bandgap semiconductor materials. The first sidewall electrode 2081 and the second sidewall electrode 2082 may have the same composition, which may include tungsten, nickel, tantalum, titanium, aluminum, copper, cobalt, tantalum nitride, titanium nitride, ruthenium or other suitable conductive materials. The first gate dielectric layer 2061 and the first sidewall electrode 2081 may be collectively referred to as a first gate structure. The second gate dielectric layer 2062 and the second sidewall electrode 2082 may be collectively referred to as a second gate structure.

Various configurations for the first source/drain contact 210 and the second source/drain contact 212 are possible. In some implementations, the first source/drain contact 210 and the second source/drain contact 212 may wrap around the source/drain regions 204SD of the ferroelectric semiconductor fin structure 204. That is, the first source/drain contact 210 and the second source/drain contact 212 are in contact with the top surface and two sidewalls of the ferroelectric semiconductor fin structure 204. In some alternative embodiments, the source/drain regions 204SD of the ferroelectric semiconductor fin structure 204 are first recessed to form source/drain recesses and the first source/drain contact 210 and the second source/drain contact 212 are deposited in the source/drain recesses. In some implementations, the first source/drain contact 210 and the second source/drain contact 212 may include tungsten, nickel, tantalum, titanium, aluminum, copper, cobalt, tantalum nitride, titanium nitride, ruthenium or other suitable conductive materials.

The fifth semiconductor device 200 may be applied as a memory device. More than one mode of operation is possible. In some embodiment, the second sidewall electrode 2082 may serve as a gate for READ operations and the first sidewall electrode 2081 may serve as a gate for WRITE operations. In other words, the fifth semiconductor device 200 may be used as a dual-port memory device. In an example WRITE operation, a positive write voltage may be applied to the first sidewall electrode 2081 to induce a first polarization ($P_1$) in the ferroelectric semiconductor fin structure 204 and a negative write voltage may be applied to the first sidewall electrode 2081 to induce a second polarization ($P_2$) in the ferroelectric semiconductor fin structure 204. The first and second polarizations induce sheet immobile charge densities of opposite signs at the left and right sidewall interfaces of the ferroelectric semiconductor fin structure 204. The immobile charges originate from charged atoms that physically move in response to the positive and negative write voltages. The first polarization ($P_1$) and the second polarization ($P_2$) may increase or lower the threshold voltage of the channel in the ferroelectric semiconductor fin structure 204. When a read voltage is applied at the second sidewall electrode 2082, the read voltage may result in different on-state current levels as the threshold voltage has been shifted by the polarization. The difference states allow a read of the data stored in the fifth semiconductor device 200. The induced remnant polarization is bi-stable (i.e., stable in one of two states unless a write voltage is applied). Once the first polarization or the second polarization is written into the ferroelectric semiconductor fin structure 204, such polarization may retain in the ferroelectric semiconductor fin structure 204 without further power consumption at the first sidewall electrode 2081.

In some alternative embodiments, both the first sidewall electrode 2081 and the second sidewall electrode 2082 may be used as gates for the WRITE operation. In a WRITE operation, applying voltages of the same magnitude by of different polarities to both sidewall electrodes on both sidewalls of the ferroelectric semiconductor fin structure 204 may help reduce the write voltage to half as compared to use of only one of the sidewall electrodes. In still some embodiments, both the first sidewall electrode 2081 and the second sidewall electrode 2082 may be used as gates for the READ operation. In these embodiments, the same read voltage may be applied to the first sidewall electrode 2081 and the second sidewall electrode 2082 to read the data stored in the ferroelectric semiconductor fin structure 204 in the formed of the first polarization ($P_1$) and the second polarization ($P_2$).

Figure 6:
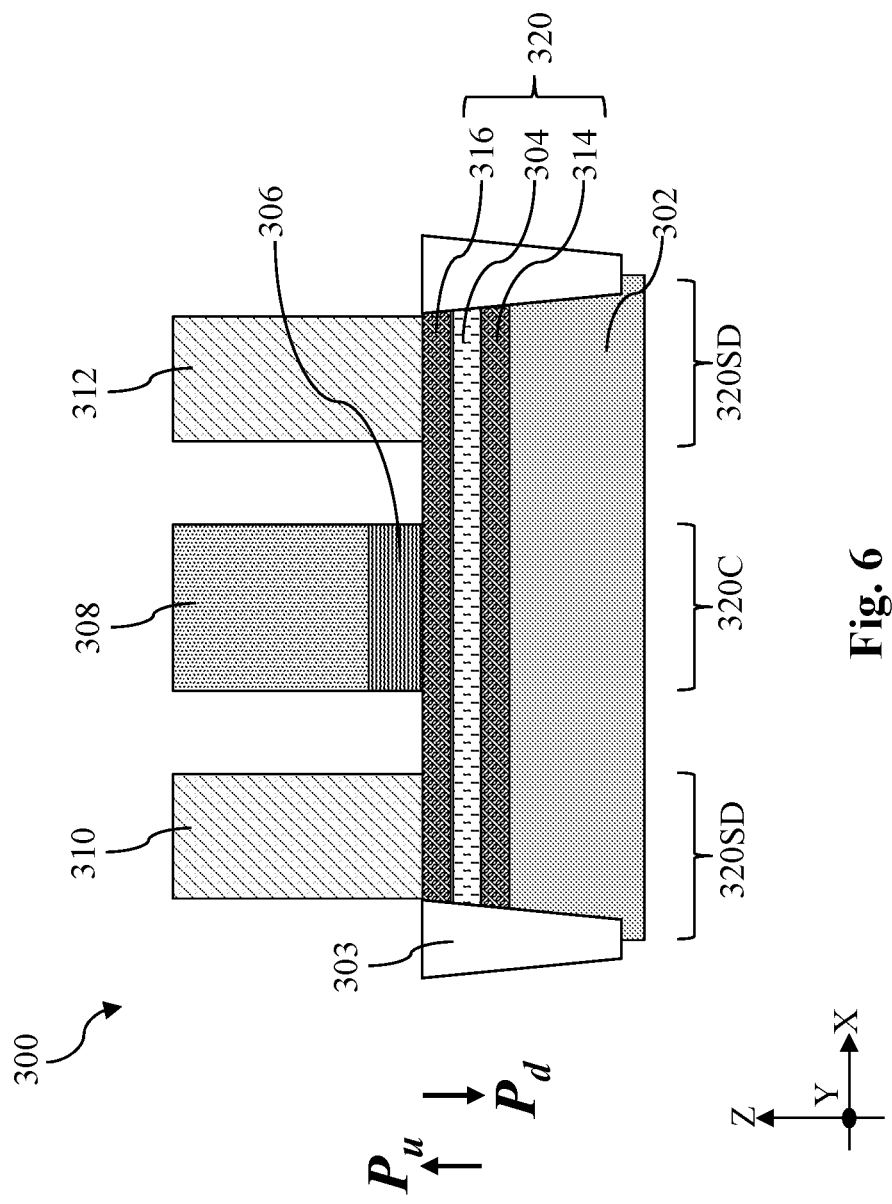
FIG. 6 illustrates a schematic cross-sectional view of another semiconductor device, according to various aspects of the present disclosure.

FIG. 6 illustrates fragmentary cross-sectional views of a sixth semiconductor device 300 according to aspects of the present disclosure. The sixth semiconductor device 300 is a FCFET as well. As shown in FIG. 6, the sixth semiconductor device 300 includes a substrate 302, a composite ferroelectric channel layer 320 disposed over the substrate 302, a gate dielectric layer 306 disposed over a channel region 320C of the composite ferroelectric channel layer 320, a gate electrode 308 over the gate dielectric layer 306, a first source/drain contact 310 and a second source/drain contact 312 disposed over the source/drain regions 320SD of the composite ferroelectric channel layer 320. According to some embodiments of the present disclosure, the substrate 302 may be formed of silicon, silicon oxide, silicon carbide, gallium nitride, or aluminum gallium nitride. In some embodiments, the gate dielectric layer 306 may be formed of hafnium oxide, silicon oxide, aluminum oxide, aluminum nitride, other suitable high-k dielectric material, or other wide bandgap semiconductor material. The gate electrode 308 may be formed of tungsten, nickel, tantalum, titanium, aluminum, copper, cobalt, tantalum nitride, titanium nitride, ruthenium or other suitable conductive materials. The gate dielectric layer 306 and the gate electrode 308 may be collectively referred to as a gate structure. The first source/drain contact 310 and the second source/drain contact 312 may be formed of tungsten, nickel, tantalum, titanium, aluminum, copper, cobalt, tantalum nitride, titanium nitride, ruthenium or other suitable conductive materials. In the embodiment depicted in FIG. 6, the sixth semiconductor device 300 may include isolation feature 303 to isolate it from neighboring devices.

The composite ferroelectric channel layer 320 is a multilayer. In some embodiments shown in FIG. 6, the composite ferroelectric channel layer 320 includes a ferroelectric semiconductor layer 304 sandwiched between a bottom nitride layer 314 and a top nitride layer 316. The bottom nitride layer 314 may be a III-V compound semiconductor material that may or may not be doped with a dopant. In an example, the bottom nitride layer 314 may be formed of gallium nitride. When remote coulomb scattering and smaller switching voltage is desired in some implementations, the bottom nitride layer 314 may be doped with indium such that the bottom nitride layer 314 includes indium-doped gallium nitride. The ferroelectric semiconductor layer 304 may be a doped III-V compound semiconductor material that exhibits ferroelectricity. In an example, the ferroelectric semiconductor layer 304 may include scandium doped gallium nitride, scandium doped indium nitride, or scandium doped indium gallium nitride. The ferroelectric semiconductor layer 304 has a wurtzite crystalline structure and the (0001) crystalline face is on the X-Y plane. In other words, the <0001> crystalline direction, which is normal to the (0001) crystalline face, extends along the Z direction. In some embodiments, the top nitride layer 316 may include a III-V compound semiconductor that may or may not be doped with a dopant. In an example, the top nitride layer 316 may include gallium nitride. When a higher electron mobility is desired, the top nitride layer 316 may be doped with indium as indium-doped gallium nitride has a smaller bandgap than gallium nitride. In some alternative embodiments, the top nitride layer 316 may be formed of aluminum nitride, which is a wide bandgap semiconductor material. In these embodiments, when formed of aluminum nitride, the top nitride layer 316 is used as a capping layer to keep charge carriers away from interface with the gate dielectric layer 306.

Figure 16:
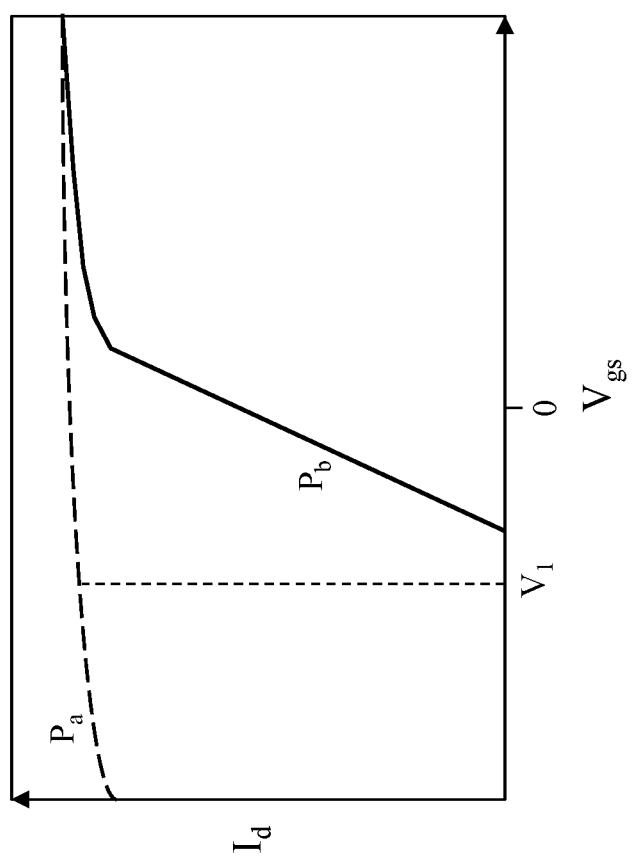
FIG. 16 illustrates a characteristic curve of a hypothetical device when pinning takes place.

The sixth semiconductor device 300 may be needed when one of the two remnant polarizations in the ferroelectric semiconductor layer 304 is so strong such that the conduction band energy is bent to or below the Fermi energy level. This phenomenon may be referred to as Fermi level pinning. FIG. 16 is a characteristic curve of a hypothetical FCFET when pinning happens. The characteristic curve illustrates drain current ($I_d$) of the hypothetical FCFET at different gate voltage ($V_{gs}$, or gate-source voltage). The FCFET charted in FIG. 16 has two polarization states—$P_a$ and $P_b$ and pinning takes place when polarization state $P_a$ bends the conduction band down to the Fermi level. During a READ operation with a first read voltage V1, drain current conducts when the device is in the $P_a$ polarization state and shuts off when the device is in the $P_b$ polarization state. While pinning may be useful in some applications, a pinned polarization state may not be switched off without substantial numbers of cycles or an increased voltage. Such an increased voltage may damage the FCFET. The bottom nitride layer 314 and the top nitride layer 316 in the sixth semiconductor device 300 may be used to modulate or attenuate the overly strong remnant polarization.

The READ and WRITE operations of the sixth semiconductor device 300 may be similar to those of the second semiconductor device 100-2, except that polarization in the sixth semiconductor device 300 is only induced in the ferroelectric semiconductor layer 304 in the composite ferroelectric channel layer 320. Detailed description of the READ and WRITE operations of the sixth semiconductor device 300 may be omitted for brevity.

Figure 7:
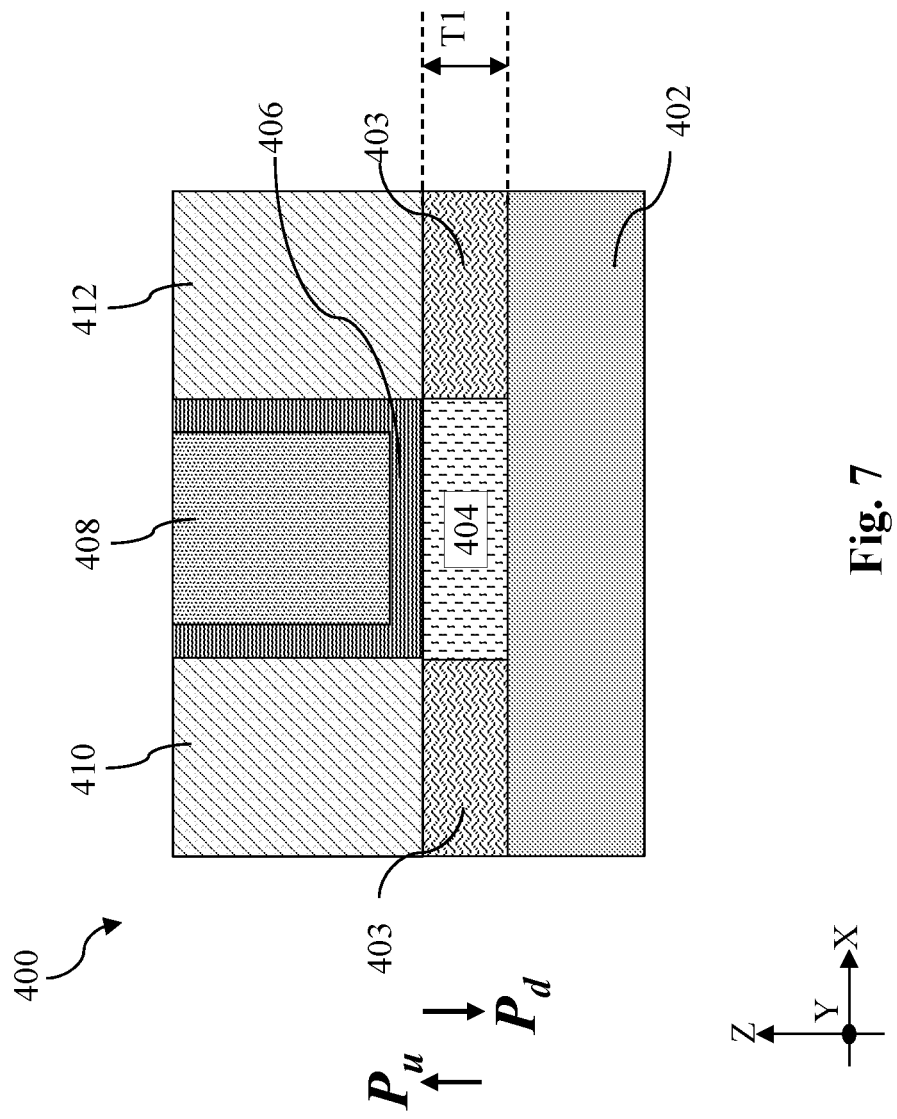
FIG. 7 illustrates a schematic cross-sectional view of still another semiconductor device, according to various aspects of the present disclosure.

Reference is made to FIG. 7, which illustrates a cross-sectional view of a seventh semiconductor device 400 according to various aspects of the present disclosure. The seventh semiconductor device 400 is also a FCFET. As shown in FIG. 7, the seventh semiconductor device 400 includes a substrate 402, a source/drain feature 403, a ferroelectric channel feature 404, a gate dielectric layer 406 disposed over the ferroelectric channel feature 404, a gate electrode 408 over the gate dielectric layer 406, a first source/drain contact 410 and a second source/drain contact 412 disposed over the source/drain features 403. According to some embodiments of the present disclosure, the substrate 402 may be formed of silicon, silicon oxide, silicon carbide, gallium nitride, or aluminum gallium nitride. The ferroelectric channel feature 404 may include a III-V compound semiconductor and a dopant. The III-V compound semiconductor may include gallium nitride, indium nitride, or indium gallium nitride. The dopant may include scandium. The ferroelectric channel feature 404 has a wurtzite crystalline structure and the (0001) crystalline face is on the X-Y plane. In other words, the <0001> crystalline direction, which is normal to the (0001) crystalline face, extends along the Z direction. The source/drain feature 403 may include the same III-V compound semiconductor in the ferroelectric channel feature 404 but is substantially free of the dopant. The ferroelectric channel feature 404 is ferroelectric but the source/drain feature 403 is not. A composition of the gate dielectric layer 406 may be different from that of the ferroelectric channel feature 404. In some embodiments, the gate dielectric layer 406 may be formed of hafnium oxide, silicon oxide, aluminum oxide, aluminum nitride, other suitable high-k dielectric material, or other wide bandgap semiconductor material. The gate electrode 408 may be formed of tungsten, nickel, tantalum, titanium, aluminum, copper, cobalt, tantalum nitride, titanium nitride, ruthenium or other suitable conductive materials. The gate dielectric layer 406 and the gate electrode 408 may be collectively referred to as a gate structure. In some implementations, the first source/drain contact 410 and the second source/drain contact 412 may include tungsten, nickel, tantalum, titanium, aluminum, copper, cobalt, tantalum nitride, titanium nitride, ruthenium or other suitable conductive materials. The gate dielectric layer 406 lines the bottom surface and sidewalls of the gate electrode 408. As shown in FIG. 7, a portion of the gate dielectric layer 406 is disposed between the gate electrode 408 and the first source/drain contact 410 (or the second source/drain contact 412).

Figure 8:
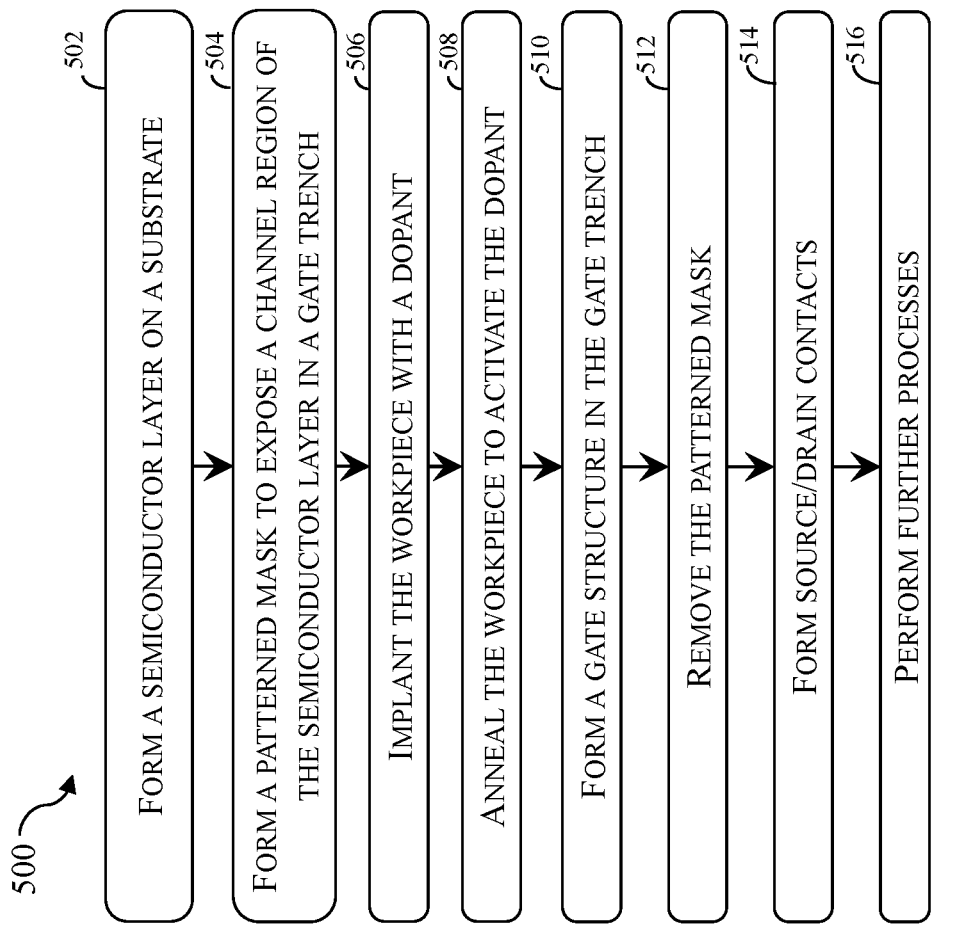
FIG. 8 is a flowchart of a method for fabricating a semiconductor device, according to various aspects of the present disclosure.

FIG. 8 illustrates a flowchart of a method 500 for fabricating the seventh semiconductor device 400 in FIG. 7.

Additional steps can be provided before, during, and after the method 500, and some of the steps described can be replaced or eliminated for other embodiments of the method 500. Operations of the method 500 may be better described in conjunction with FIGS. 9-15, which are fragmentary cross-sectional diagrammatic views of a workpiece 400 at various fabrication stages of a method, such as method 500 of FIG. 8. Here, because the seventh semiconductor device 400 is formed from the workpiece 400, they share the same reference numeral for ease of reference. FIGS. 9-15 have been simplified for the sake of clarity to better understand the inventive concepts of the present disclosure. Additional features can be added in workpiece 400, and some of the features described below can be replaced, modified, or eliminated in other embodiments of workpiece 400.

Figure 9:
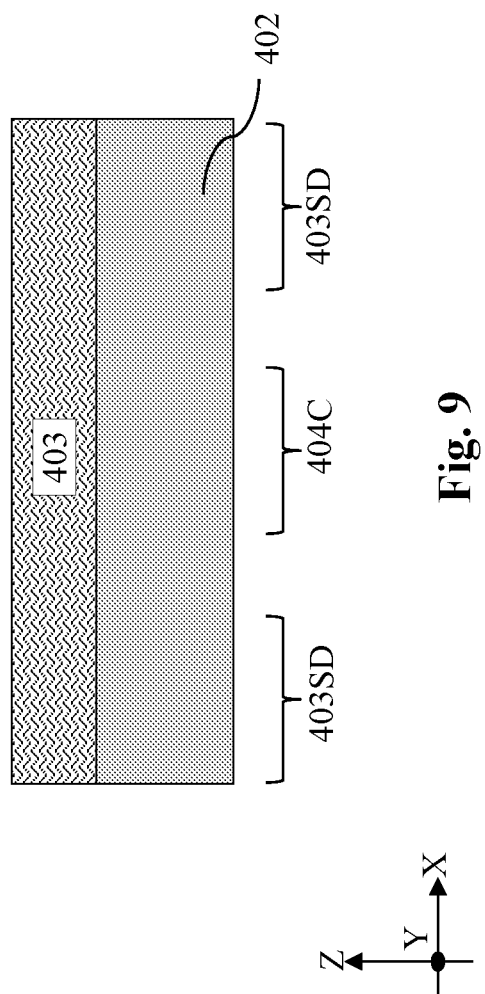
FIGS. 9-15 are fragmentary cross-sectional views of a workpiece at various stages of a method, such as the method in FIG. 8, according to various aspects of the present disclosure.

Referring to FIGS. 8 and 9, method 500 includes a block 502 where a semiconductor layer 403 is formed on a substrate 402 of a workpiece 400. As described above, the substrate 402 may be formed of silicon, silicon oxide, silicon carbide, gallium nitride, or aluminum gallium nitride. The semiconductor layer 403 may include a III-V compound semiconductor such as gallium nitride, indium nitride, or indium gallium nitride. The semiconductor layer 403 may be formed on the substrate 402 by epitaxial growth or layer transfer. When the semiconductor layer 403 is formed on the substrate 402 by epitaxial growth, the semiconductor layer 403 may be deposited on the substrate 402 using molecular beam epitaxy (MBE), vapor phase epitaxy (VPE), or metalorganic CVD (MOCVD). For example, gallium nitride, indium nitride, or indium gallium nitride may be deposited on a silicon substrate having a (111) crystal surface, a silicon carbide substrate, or a gallium nitride substrate. When the semiconductor layer 403 is formed on the substrate 402 by layer transfer, the semiconductor layer 403 may first be deposited on a crystalline carrier substrate that is formed of silicon, silicon carbide, or gallium nitride. Then the semiconductor layer 403 may be transferred to a silicon oxide substrate.

Figure 10:
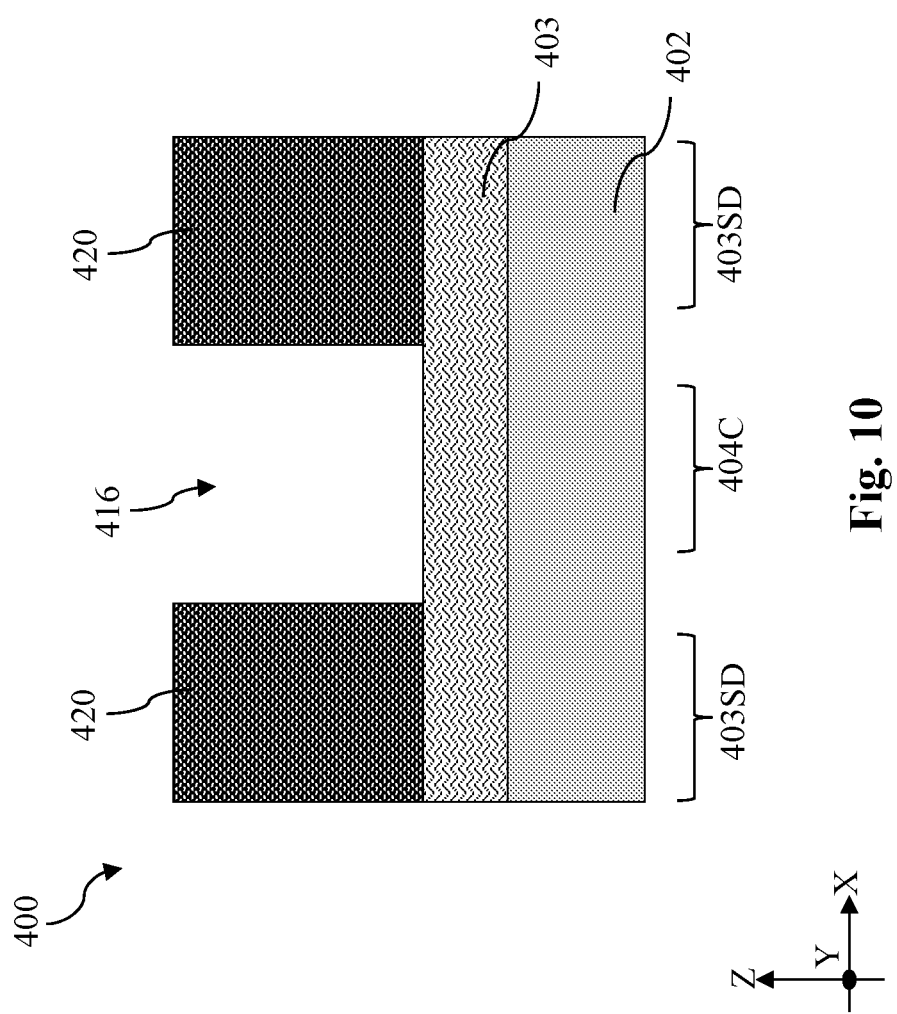

Referring to FIGS. 8 and 10, method 500 includes a block 504 where a patterned mask 420 is formed to expose a channel region 404C of the semiconductor layer 403. In some embodiments, a mask layer is first deposited on the semiconductor layer 403 by spin-on coating, chemical vapor deposition (CVD), or atomic layer deposition (ALD). In some implementations, the mask layer may be a single layer or a multi-layer and may include silicon oxide, silicon nitride, silicon oxynitride, or a bottom antireflective coating (BARC). The mask layer is then patterned using photolithography processes and etch processes to form the patterned mask 420 in FIG. 10. In an example photolithography process, a photoresist layer is deposited over the mask layer. The deposited photoresist layer is soft-baked, exposed to radiation reflected from or transmitting through a photomask, baked in a post-bake process, and developed in a developer solution, to form a patterned photoresist layer. The patterned photoresist layer is used as an etch mask to pattern the mask layer to form the patterned mask 420. In some implementations represented in FIG. 10, the patterned mask 420 substantially covers the source/drain regions 403SD of the semiconductor layer 403, leaving the channel region 403C exposed. The opening defined by the patterned mask 420 may be referred to as a gate opening 416 as a gate structure 409 (to be described below) is going to be deposited therein.

Figure 11:
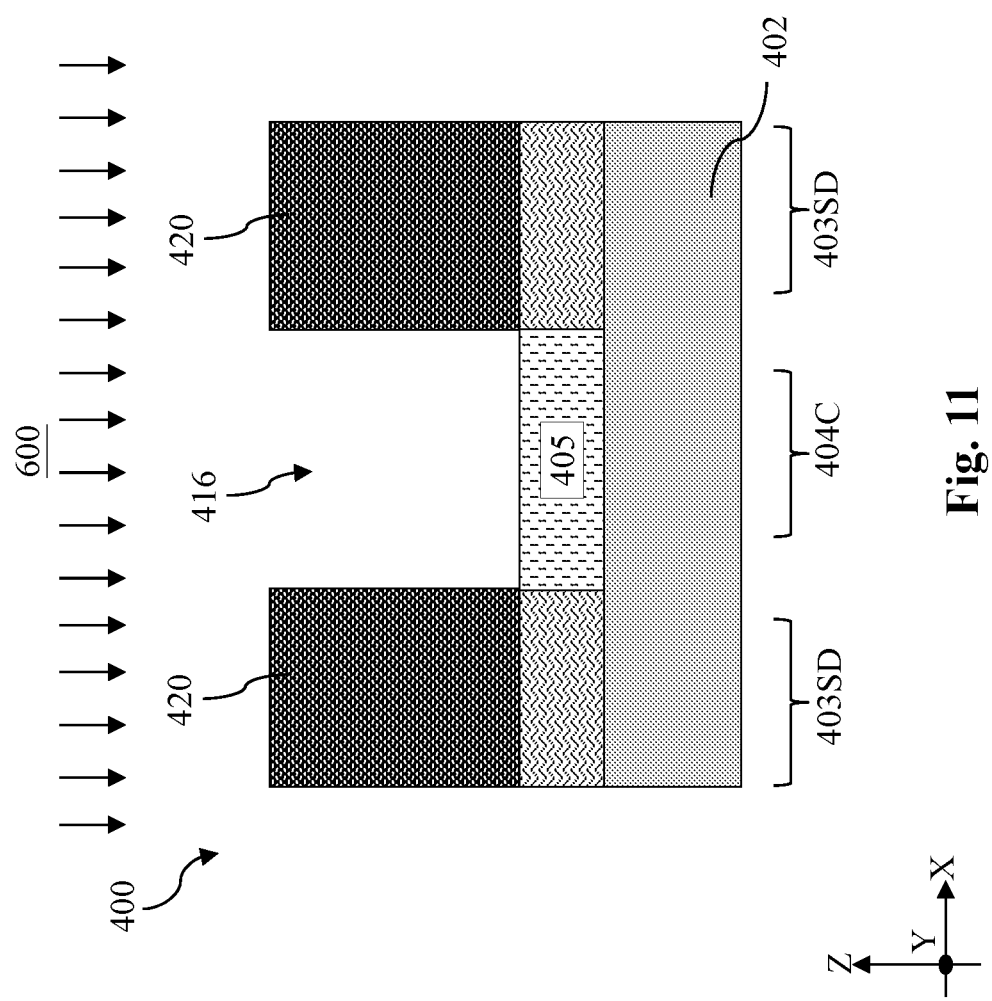

Referring to FIGS. 8 and 11, method 500 includes a block 506 where the workpiece 400 is implanted with a dopant in an implantation process 600. In some embodiments, the implantation process 600 implants scandium into the channel region 403C of the semiconductor layer 403 to form a doped semiconductor feature 405 in the channel region 403C. At block 506, the patterned mask 420 serves as an implantation mask to mask off the source/drain regions 403SD of the semiconductor layer 403 such that the source/drain regions 403SD is substantially free of the dopant. Upon conclusion of block 506, the semiconductor layer 403 over the source/drain region 403SD may be referred to as source/drain features 403 based their functions and locations.

Figure 12:
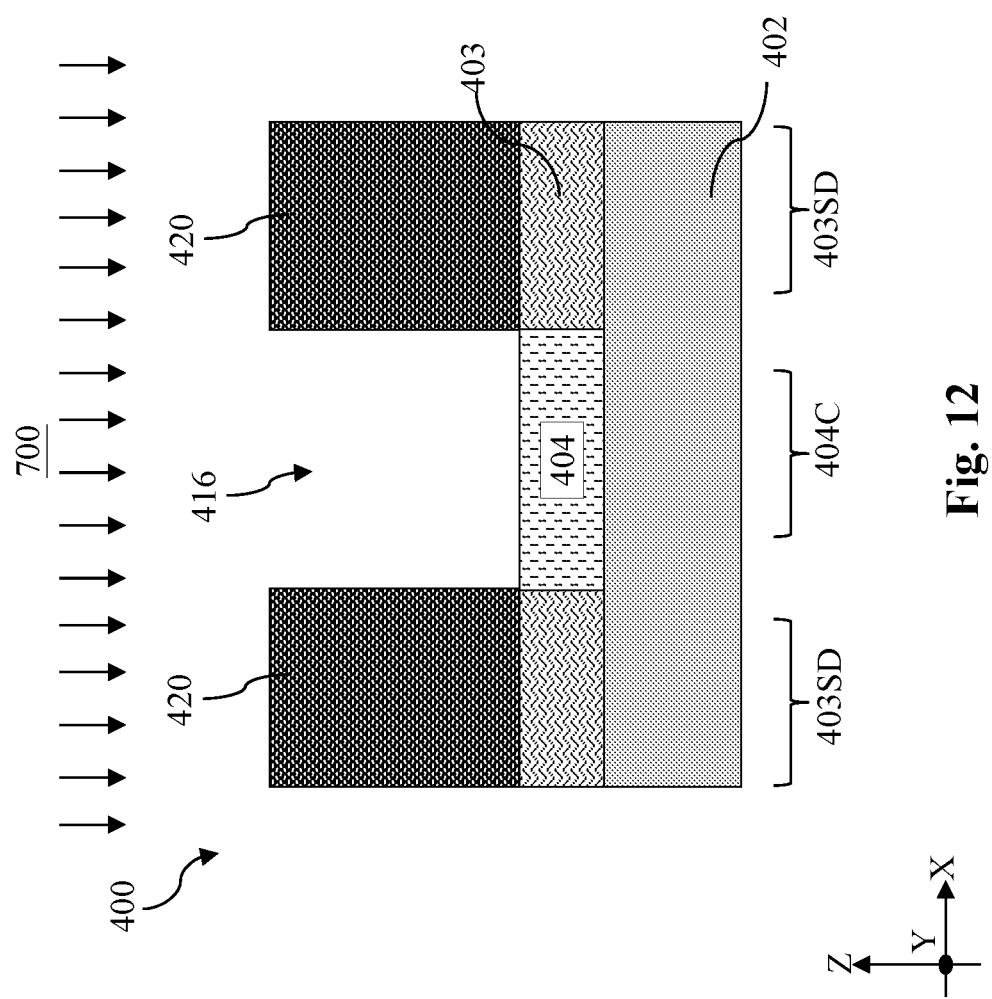

Referring to FIGS. 8 and 12, method 500 includes a block 508 where the workpiece 400 is annealed in an anneal process 700. At block 508, the implanted dopant in the doped semiconductor feature 405 is activated by the anneal process 700 to form the ferroelectric channel feature 404. In some embodiments, the anneal process 700 may be a furnace anneal process, a laser anneal process, a flash anneal process, a rapid thermal anneal (RTA) process, a suitable anneal process, or a combination thereof. In some implementations, the anneal process 700 includes an anneal temperature between about 450° C. and about 850° C. At block 508, activation of the dopant may give rise to the ferroelectricity in the ferroelectric channel feature 404.

Figure 13:
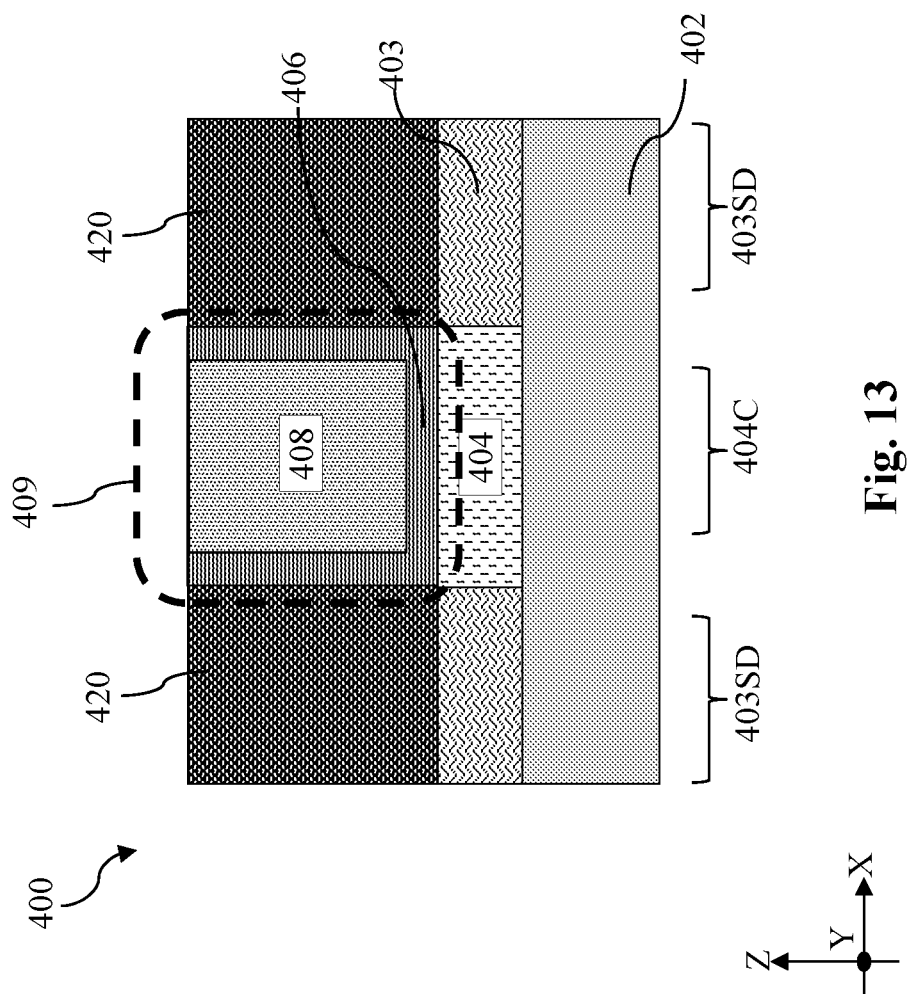

Referring to FIGS. 8 and 13, method 500 includes a block 510 where a gate structure 409 is formed. As described above, the gate structure 409 may include the gate dielectric layer 406 and the gate electrode 408. The gate dielectric layer 406 may be formed of hafnium oxide, silicon oxide, aluminum oxide, aluminum nitride, other suitable high-k dielectric material, or other wide bandgap semiconductor material. The gate electrode 408 may be formed of tungsten, nickel, tantalum, titanium, aluminum, copper, cobalt, tantalum nitride, titanium nitride, ruthenium or other suitable conductive materials. The gate dielectric layer 406 may be conformally deposited over the workpiece 400, including over the gate opening 416, using ALD or CVD. After the conformal deposition of the gate dielectric layer, a gate electrode layer 408 may be deposited over the workpiece 400 to fill the rest of the gate opening 416, using PVD, CVD, or MOCVD. While not explicitly shown, after the deposition of the gate dielectric layer 406 and the gate electrode layer 408, a planarization process, such as a chemical mechanical polishing (CMP) process, may be performed to remove excess material from the top surfaces of the patterned mask 420.

Figure 14:
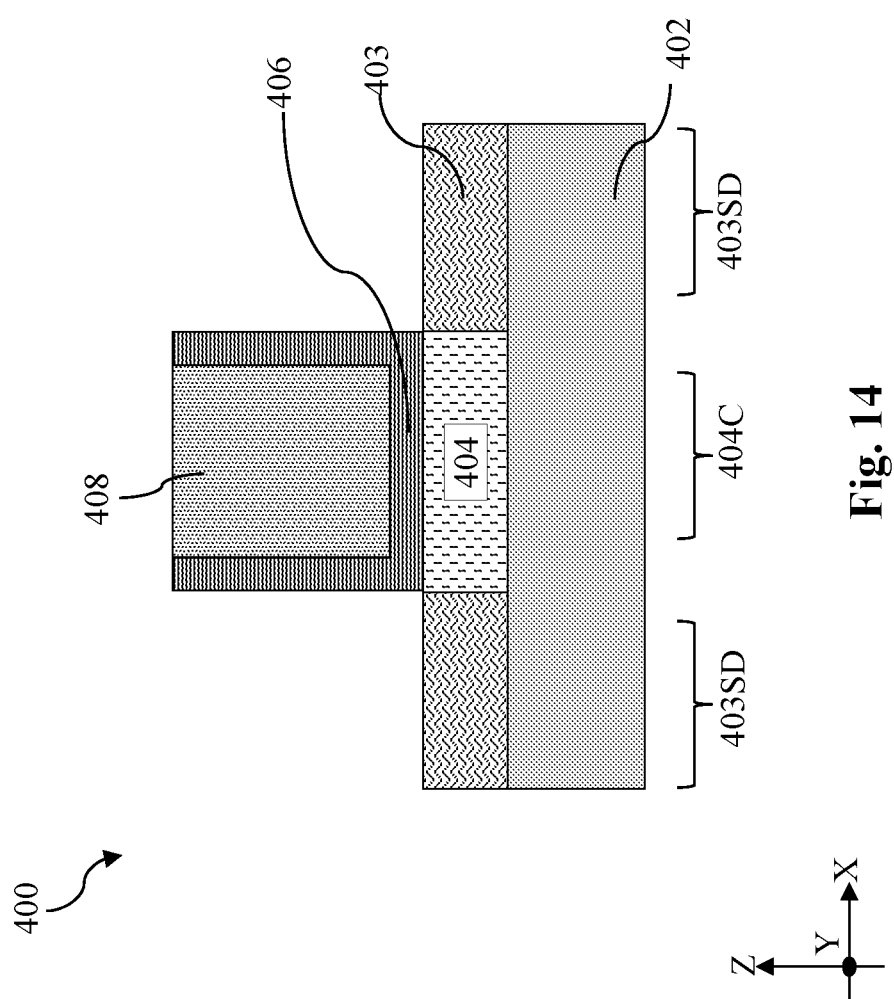

Referring to FIGS. 8 and 14, method 500 includes a block 512 where the patterned mask 420 is removed. After the excess material over the patterned mask 420 is removed at block 510, the patterned mask 420 is exposed. At block 512, the patterned mask 420 may be selectively removed using a dry etch process or a wet etch process. An example dry etch process may include use of hydrogen fluoride and ammonia.

Figure 15:
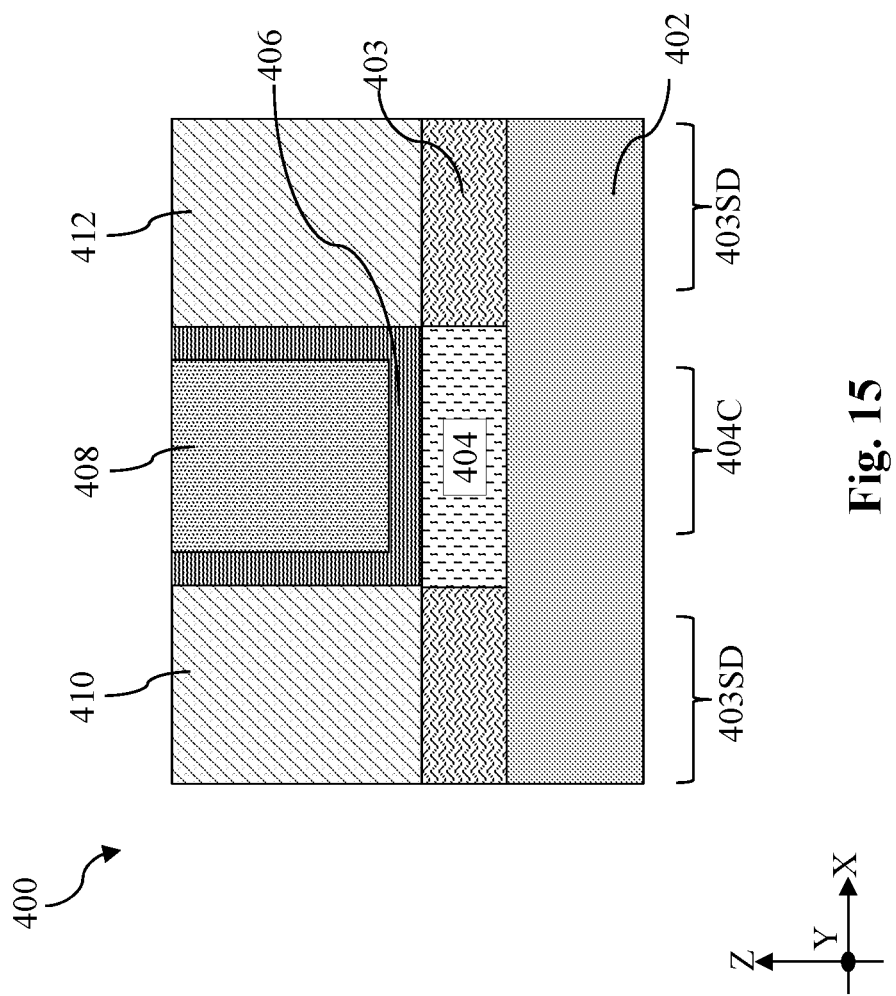

Referring to FIGS. 8 and 15, method 500 includes a block 514 where the first source/drain contact 410 and the second source/drain contact 412 are formed over the source/drain regions 403SD. As described above, the first source/drain contact 410 and the second source/drain contact 412 may include tungsten, nickel, tantalum, titanium, aluminum, copper, cobalt, tantalum nitride, titanium nitride, ruthenium or other suitable conductive materials. In some embodiments, the first source/drain contact 410 and the second source/drain contact 412 may be deposited using PVD, CVD, or MOCVD.

Referring to FIG. 8, method 500 includes a block 516 where further processes are performed. Such further processes may include deposition of an interlayer dielectric (ILD) layer over the workpiece 400, formation of a gate contact, and formation of a source/drain contact via. The gate contact is electrically coupled to the gate structure 409 and the source/drain contact via is electrically coupled to the source/drain contacts (including the first source/drain contact 410 and the second source/drain contact 412). These further processes connect the seventh semiconductor device 400 with other devices or an external circuit.

Embodiments of the present disclosure provide advantages. The present disclosure provides FCFETs of which the channel includes a ferroelectric semiconductor material. In some implementations, the ferroelectric semiconductor material includes a III-V compound semiconductor material, such as gallium nitride, indium nitride, and indium gallium nitride, and is doped with a dopant such as scandium (Sc). The doped III-V compound semiconductor material of the present disclosure only has a single crystalline phase and its placement in the channel allows it to have a desired thickness without harming the scalability of the semiconductor device. In addition, because the doped III-V compound semiconductor material of the present disclosure only has a single crystalline phase, the FCFETs of the present disclosure do not require wake-up cycles and do not suffer from ferroelectricity fatigue.

The present disclosure provides for many different embodiments. In one embodiment, a semiconductor device is provided. The semiconductor device includes a ferroelectric structure having a channel region and a source/drain region, a gate dielectric layer disposed over the channel region of the ferroelectric structure, a gate electrode disposed on the gate dielectric layer, and a source/drain contact disposed on the source/drain region of the ferroelectric structure. The ferroelectric structure includes gallium nitride, indium nitride, or indium gallium nitride and the ferroelectric structure is doped with a dopant.

In some embodiments, the dopant includes scandium. In some embodiments, the semiconductor device further includes a substrate underlying the ferroelectric structure and the substrate includes silicon, silicon oxide, gallium nitride, or aluminum gallium nitride. In some implementations, the gate dielectric layer includes silicon oxide, hafnium oxide, or a wide bandgap semiconductor material. In some instances, the wide bandgap semiconductor material includes aluminum nitride. In some embodiments, the semiconductor device may further include a back gate dielectric layer underlying the ferroelectric structure, and a back gate electrode underlying the back gate dielectric layer. The ferroelectric structure is disposed directly on the back gate dielectric layer and the back gate dielectric layer is disposed directly on the back gate electrode. In some implementations, a thickness of the back gate dielectric layer is greater than a thickness of the gate dielectric layer. In some embodiments, the semiconductor device may further include a first nitride layer on the ferroelectric structure and a second nitride layer underlying the ferroelectric structure. The first nitride layer is selected from a group consisting of gallium nitride, indium gallium nitride, or aluminum nitride and the second nitride layer includes gallium nitride.

In another embodiment, a semiconductor device is provided. The semiconductor device includes a ferroelectric semiconductor fin structure including a first sidewall and an opposing second sidewall, a first gate dielectric layer on the first sidewall, a first sidewall electrode along a sidewall of the first gate dielectric layer, a second gate dielectric layer on the second sidewall, and a second sidewall electrode along a sidewall of the second gate dielectric layer. The ferroelectric semiconductor fin structure includes a III-V semiconductor material and a dopant. In some implementations, the III-V semiconductor material is selected from a group consisting of indium nitride, gallium nitride and indium gallium nitride. In some instances, the dopant includes scandium. In some embodiments, the semiconductor device may further include a substrate. The ferroelectric semiconductor fin structure arises from the substrate and the substrate includes silicon, silicon oxide, silicon carbide, gallium nitride, or aluminum gallium nitride. In some instances, the first gate dielectric layer and the second gate dielectric layer include silicon oxide or hafnium oxide. In some embodiments, the ferroelectric semiconductor fin structure includes a wurtzite crystalline structure having a <0001> crystalline direction extending between the first gate dielectric layer and the second gate dielectric layer.

In another embodiment, a method is provided. The method includes forming a semiconductor layer on a substrate and including a channel region and a source/drain region, depositing a mask layer over the semiconductor layer, patterning the mask layer to form a gate trench in the mask layer to expose the channel region of the semiconductor layer, implanting the channel region of the semiconductor layer with a dopant, after the implanting, annealing the semiconductor layer, forming a gate structure in the gate trench, removing the mask layer, and forming a source/drain contact over the source/drain region.

In some embodiments, the substrate includes silicon, silicon oxide, silicon carbide, gallium nitride, or aluminum gallium nitride and the semiconductor layer includes gallium nitride, indium nitride, or indium gallium nitride. In some implementations, the forming of the semiconductor layer includes epitaxially growing the semiconductor layer on the substrate. In some instances, the forming of the semiconductor layer includes epitaxially growing the semiconductor layer on a carrier substrate and transferring the semiconductor layer on the substrate. In some implementations, the dopant includes scandium. In some embodiments, the annealing includes an anneal temperature between about 450° C. and about 850° C. to give rise to ferroelectricity of the channel region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
  a substrate;
  a III-V compound semiconductor layer over the substrate and comprising a first source/drain region, a second source/drain region, and a channel region sandwiched between the first source/drain region and the second source/drain region;
  a first source/drain contact disposed over and in contact with the first source/drain region;
  a second source/drain contact disposed over and in contact with the second source/drain region;

a gate dielectric layer continuously disposed along a sidewall of the first source/drain contact, a top surface of the channel region, and a sidewall of the second source/drain contact; and
a gate electrode disposed over the gate dielectric layer and spaced apart from the sidewall of the first source/drain contact, the top surface of the channel region, and the sidewall of the second source/drain contact by the gate dielectric layer,
wherein the channel region is doped with a dopant to exhibit ferroelectric property,
wherein the first source/drain region and the second source/drain region are free of the dopant.

2. The semiconductor device of claim 1, wherein the III-V compound semiconductor layer comprises gallium nitride, indium nitride, or indium gallium nitride.

3. The semiconductor device of claim 1, wherein the dopant comprises scandium (Sc).

4. The semiconductor device of claim 1, wherein the channel region comprises a wurtzite crystalline structure.

5. The semiconductor device of claim 4, wherein a horizontal surface of the channel region comprises a (0001) crystalline face.

6. The semiconductor device of claim 1, wherein the gate dielectric layer comprises hafnium oxide, silicon oxide, aluminum oxide, or aluminum nitride.

7. The semiconductor device of claim 1, wherein the first source/drain contact and the second source/drain contact comprise tungsten, nickel, tantalum, titanium, aluminum, copper, cobalt, tantalum nitride, titanium nitride, or ruthenium.

8. A semiconductor device, comprising:
a ferroelectric structure comprising a first source/drain region, a second source/drain region, and a channel region sandwiched between the first source/drain region and the second source/drain region along a direction;
a front gate dielectric layer disposed over the channel region;
a front gate electrode disposed over the front gate dielectric layer;
a first source/drain contact over the first source/drain region;
a second source/drain contact over the second source/drain region;
a back gate dielectric layer disposed below and in contact with a bottom surface of the ferroelectric structure; and
a back gate electrode disposed below and in contact with a bottom surface of the back gate dielectric layer,
wherein the front gate dielectric layer comprises a first width along the direction and the back gate dielectric layer comprises a second width along the direction,
wherein the first width is greater than the second width.

9. The semiconductor device of claim 8, wherein the back gate dielectric layer is disposed directly below the front gate dielectric layer.

10. The semiconductor device of claim 8, wherein the back gate dielectric layer is off-centered such that a geometric center line of the front gate electrode is not aligned with a geometric center line of the back gate electrode.

11. The semiconductor device of claim 8, wherein the ferroelectric structure comprises gallium nitride, indium nitride, or indium gallium nitride.

12. The semiconductor device of claim 11, wherein the ferroelectric structure comprises scandium as a dopant.

13. The semiconductor device of claim 8,
wherein the front gate dielectric layer comprises a first thickness,
wherein the back gate dielectric layer comprises a second thickness greater than the first thickness.

14. The semiconductor device of claim 8, wherein the front gate dielectric layer and the back gate dielectric layer comprise hafnium oxide, silicon oxide, aluminum oxide, aluminum nitride.

15. The semiconductor device of claim 8, wherein, along the direction, the ferroelectric structure is sandwiched between two isolation structures.

16. The semiconductor device of claim 15, wherein the two isolation structures comprise silicon oxide.

17. A semiconductor device, comprising:
a ferroelectric structure comprising a first source/drain region, a second source/drain region, and a channel region sandwiched between the first source/drain region and the second source/drain region along a direction;
a front gate dielectric layer disposed over the channel region;
a front gate electrode disposed over the front gate dielectric layer;
a first source/drain contact over the first source/drain region;
a second source/drain contact over the second source/drain region;
a back gate dielectric layer disposed below and in contact with a bottom surface of the ferroelectric structure; and
a back gate electrode disposed below and in contact with a bottom surface of the back gate dielectric layer,
wherein the ferroelectric structure comprises III-V semiconductor and a dopant,
wherein the front gate dielectric layer comprises a first thickness,
wherein the back gate dielectric layer comprises a second thickness greater than the first thickness.

18. The semiconductor device of claim 17,
wherein the III-V semiconductor comprise gallium nitride, indium nitride, or indium gallium nitride,
wherein the dopant comprises scandium (Sc).

19. The semiconductor device of claim 17,
wherein the front gate dielectric layer comprises a first width along the direction and the back gate dielectric layer comprises a second width along the direction,
wherein the first width is greater than the second width.

20. The semiconductor device of claim 19, wherein the back gate dielectric layer is disposed directly below the front gate dielectric layer.

* * * * *